United States Patent [19]

Nakayama et al.

[11] Patent Number: 4,859,505

[45] Date of Patent: Aug. 22, 1989

[54] PROCESS FOR METALLIZING GLASS SURFACE

[75] Inventors: Hajime Nakayama, Shimotsuma; Kouichi Tsuyama; Toshiro Okamura, both of Shimodate, all of Japan

[73] Assignee: Hitachi Chemical Co., Ltd., Tokyo, Japan

[21] Appl. No.: 32,248

[22] Filed: Mar. 31, 1987

[30] Foreign Application Priority Data

Mar. 31, 1986 [JP] Japan ................................. 61-73835
Aug. 25, 1986 [JP] Japan ................................ 61-198379

[51] Int. Cl.$^4$ ............................................. C23C 18/24
[52] U.S. Cl. .................................. 427/305; 427/309; 156/647; 156/663
[58] Field of Search ................ 427/309, 305; 156/647, 156/663

[56] References Cited

U.S. PATENT DOCUMENTS

| 3,093,503 | 6/1963 | Laszlo | 427/309 |
| 4,666,744 | 5/1987 | Deluca | 427/309 |

FOREIGN PATENT DOCUMENTS

| 3345353 | 5/1972 | Fed. Rep. of Germany . |
| 3332029 | 3/1977 | Fed. Rep. of Germany . |
| 1361882 | 6/1981 | France . |
| 1276550 | 10/1969 | United Kingdom ................ 427/309 |

OTHER PUBLICATIONS

EP 0188065 7/86.

*Primary Examiner*—Sam Silverberg
*Attorney, Agent, or Firm*—Antonelli, Terry & Wands

[57] ABSTRACT

Crystallized glass roughened by using a roughening solution having a larger dissolving rate as to a non-crystalline phase compared with a crystalline phase, followed by metallizing by electroless plating shows strong adhesive strength between the crystallized glass substrate and the plated film.

7 Claims, No Drawings

PROCESS FOR METALLIZING GLASS SURFACE

BACKGROUND OF THE INVENTION

This invention relates to a process for metallizing a glass surface usable for forming circuits on, for example, crystalline phase-containing glass substrates, crystallized enameled substrates, ceramic substrates coated with crystalline phase-containing glass, and producing printed wiring boards.

In order to metallize crystalline phase-containing glass (hereinafter referred to as "crystallized glass") surfaces, particularly to form circuits in the production of printed circuit boards, there have been known (1) a thick film process wherein a wiring pattern is formed on a substrate with a metallic paste by firing, and (2) a thin film process wherein a wiring pattern is formed on a substrate by sputtering or chemical vapor deposition (CVD). But the thick film process (1) has problems in that since a circuit is formed by a printing method, it is difficult to form wiring (circuit formation) on inner walls of through-holes of a substrate or curved portions at ends of a substrate, and since the firing temperature is as high as higher than 800° C., a noble metal paste should be used in order to prevent oxidation, which results in making the production cost high. On the other hand, the thin film process (2) has problems in that it is difficult to form wiring (circuit formation) on inner walls of through-holes of a substrate or curved portions at ends of a substrate like the thick film process, this process is not suitable for mass production, and it is difficult to make the metal film thickness large, etc.

In order to solve such problems, it is proposed to conduct electroless plating on crystallized glass surfaces. For example, Japanese Patent Unexamined Publication Nos. 53-5438 and 60-195078 disclose processes wherein crystallized glass surfaces are roughened by hydrofluoric acid (the former patent) and molten NaOH (the latter patent). But when hydrofluoric acid or molten NaOH is used, since these substances are too strong in corrosive force, a crystallized glass surface is dissolved irrespective of a crystalline phase or non-crystalline phase. Thus, it is difficult to control the formation of relief on the roughened surface. Further, since a weak layer is formed near the surface, an electroless plating layer formed later is peeled off together with the weak layer. Thus, it is difficult to obtain stable adhesive strength. In addition, hydrofluoric acid and molten NaOH are dangerous for handling.

SUMMARY OF THE INVENTION

It is an object of this invention to provide a process for metallizing a crystallized glass surface excellent in adhesive strength.

This invention provides a process for metallizing a crystallized glass surface comprising a crystalline phase and a non-crystalline phase which comprises
(a) a step of roughening with a roughening solution having a larger dissolving rate as to the non-crystalline phase compared with the crystalline phase,
(b) a step of adsorbing a catalyst which can start an electroless plating reaction, and
(c) a step of carrying out electroless plating.

DESCRIPTION OF THE PREFERRED EMBODIMENTS

The roughening solution used in this invention is an aqueous solution which is neutral or near neutral and has different dissolving properties for different phases with different compositions of crystallized glass.

Generally speaking, water resistance, acid resistance and alkali resistance of oxides as follows [S. Naruse: "Glass Optics" Kyoritsu Publisher Co., 1958]
Water resistance: $ZrO_2 > Al_2O_3 > TiO_2 > ZnO > MgO > PbO > CaO > BaO$
Acid resistance: $ZrO_2 > Al_2O_3 > ZnO > CaO > TiO_2 > PbO > MgO > BaO$
Resistance to NaOH: $ZrO_2 >> Al_2O_3$, $TiO_2$, $ZnO$, $CaO$
Resistance to $Na_2CO_3$: $ZrO_2 >> Al_2O_3$, $TiO_2$, $ZnO > CaO$, $BaO$, $PbO$, $MgO$ When BaO, CaO, MgO, PbO, etc. are used as crystalline components in the crystallized glass, the crystalline phase is readily dissolved by both a strong acid and a strong alkali. Thus, when a non-crystalline phase is strongly dissolved by an aqueous solution of neutral or near neutral so as to retain a crystalline phase, it is possible to form a roughened surface which can enhance adhesive strength to a plated film formed later.

Crystallized glass comprises a crystalline phase and a non-crystalline phase. Sometimes, the crystalline phase comprises several phases (compositions). In this invention, the roughening is carried out by using a roughening solution having a larger dissolving rate as to a non-crystalline phase compared with at least one phase in the crystalline phase. As a result, at least one phase in the crystalline phase is retained in the roughened surface. Thus, it is possible to form the roughened surface having larger adhesive strength to a plated film to be formed afterward.

In this invention, it is possible to use crystallized glass containing boron, silicon, magnesium and barium in amounts of $15 < B_2O_3 < 35$, $10 < SiO_2 < 30$, $40 < MgO + CaO + BaO < 65$ (in % by mole).

This crystallized glass comprises a crystalline phase containing a large amount of BaO and a borosilicate glass phase. The crystalline phase takes needle-like forms with a length of 20 μm or less and is dispersed in a non-crystalline matrix innumerably.

The roughening can be carried out by using, for example, aqueous solutions of fluoride salts such as sodium fluoride, potassium fluoride, ammonium fluoride, sodium fluoroborate, ammonium tetrafluoroborate, etc., an electroless nickel plating solution [(Blue Shumer (pH 6.4), a trade name, mfd. by Nippon Kanigen Co.]. The pH of the roughenin solution is 2 to 13, preferably 5 to 10, more preferably 6 to 9. The concentration of fluoride salts in the aqueous solution is preferably 1 to 100 g/l, more preferably 5 to 50 g/l, most preferably 10 to 20 g/l.

If necessary, it is possible to add an organic acid salt such as sodium citrate, sodium tartrate, etc., which can form a complex with Si, or to add a small amount of acid for neutralizing the aqueous solution which is alkaline (pH 7-8) by the hydrolysis of the fluoride.

The temperature of the roughening solution is 70° to 85° C., preferably 75° to 80° C. When crystallized glass is dipped in such an aqueous solution for about 50 minutes, the non-crystalline phase present in the crystallized glass is dissolved faster than the crystalline phase so as to form a roughened surface having a larger anchor effect for a plated film.

As the catalyst which can start the electroless plating reaction, there can be used conventional ones which are used for a pretreatment in the formation of circuits by electroless plating on insulating substrates. A preferable catalytic solution containing Pd catalyst is alkaline or neutral. In the catalyst adsorbing (coating) step (b), the roughened crystallized glass is dipped in a treating solution A and a treating solution B in this order (A→B) to adsorb (or coat) the catalyst.

The treating solution A can be prepared by dissolving palladium chloride in a non-aqueous solution preferably having a relative dielectric constant of 30 or more such as formamide, monomethylformamide, dimethylformamide, dimethylacetamide, methanol, or a mixture thereof.

The treating solution B can be prepared by dissolving a reducing agent for palladium such as dimethylaminoboran (DMAB), sodium borohydride ($NaBH_4$), sodium hypophosphite, etc. in the same non-aqueous solution as mentioned above.

The treating solution A may contain a small amount of water so long as a precipitate of palladium hydroxide is not caused. The treating solution B may also contain a very small amount of water so long as the reducing effect is not lowered (no palladium hydroxide is precipitated after the treatment with the treating solution B).

Further, if the plating solution to be used next contains the same reducing agent as used in the solution B, the treatment with the solution B can be omitted. In order to prolong the Life of the treating solutions A and B, it is preferable to carry out the treatment in the order of predipping→solution A→washing→solution B, more preferably by using the same solvent as used in the solution A for the predipping, and using the same solvent as used in the solution B for the washing. On the other hand, since the palladium is present in the form of solution, when the thus treated crystallized glass is washed strongly with water after the catalyst coating step with the non-aqueous solution system, the palladium sometimes is dropped off. But when the crystallized glass is immersed in a plating bath without washing, a part of the catalyst is dropped off in the plating bath and a plating metal is deposited on other than the objected article, e.g., on the plating tank, which results in decomposing the plating solution rapidly. In order to solve the above-mentioned problem, it is preferable to dip the roughened-and-catalyst coated crystallized glass in water heated at the same temperature as the plating bath first, followed by dipping in the plating bath.

The electroless plating step (c) can be carried out by using a conventional electroless plating solution used for forming circuits on insulating substrates in the production of printed wiring boards. It is preferable to use a plating bath of near neutral (pH 2-13).

According to this invention, a metal film can be formed with excellent adhesiveness on a crystallized glass surface by electroless plating. Thus, it becomes possible to form circuits by the plating method, and wiring (circuit formation) can be conducted easily in through-holes and curved portions which have been difficult. Further, since the sheet resistance value of conductor circuit can be made small and no firing is necessary, there take place no warpage of substrates, no dimensional change of substrates, and the like, which results in improving properties while lowering remarkablly the production cost.

This invention is illustrated by way of the following Examples.

EXAMPLES 1 TO 3

COMPARATIVE EXAMPLES 1 TO 3

Crystallized glass having a composition of 20% by mole of $B_2O_3$, 15% by mole of $SiO_2$, 55% by mole of MgO, 5% by mole of BaO and 5% by mole of SrO was dipped in a roughening solution under the following conditions:

TABLE 1

| Example No. | Roughening solution | Temp. (°C.) | Time (min.) |
|---|---|---|---|
| Example 1 | Blue Shumer | 75–80 | 30 |
| " 2 | Aq. soln. of NaF (12 g/l, pH 7.4) | 75–80 | 50 |
| " 3 | Aq. soln. of KF (20 g/l, pH) | 75–80 | 50 |
| Comparative Example 1 | Aq. soln. of 10 N HCl (300 ml/l) | Room. temp. | 1 |
| " 2 | Aq. soln. of HF(40%) | Room. temp. | 20 |
| " 3 | Aq. soln. of NaOH (pH 13) | 75–80 | 10 |

After dipping in an alkaline Pd seeding solution for 2 minutes, the crystallized glass was dipped in an alkaline reduction treating solution for 1 minute, followed by dipping in an electroless copper plating solution (pH 12, 70° C.) including formaldehyde as a reducing agent for 2 hours.

Adhesive strength between a copper plated film and crystallized glass was measured and listed in Table 2.

TABLE 2

| Example No. | Adhesive strength ($kg/mm^2$) |
|---|---|
| Example 1 | 1.4 |
| " 2 | 1.3 |
| " 3 | 1.0 |
| Comparative Example 1 | less than 0.2 |
| " 2 | less than 0.2 |
| " 3 | less than 0.2 |

After roughening, surface states of the roughened glass substrates were examined. That is, change of the amount of Ba (crystal component) which is contained in the crystalline phase in a large amount was examined by XMA (X-rays microanalyzer). In Examples 1-3, the spectrum of Ba was increased, but in Comparative Example 1, the spectrum of Ba was reduced and in Comparative Examples 2 and 3, the spectrum of Ba was not changed. Further, the surface states observed by SEM (scanning electron microscope) after the roughening step were as follows:

Example 1: Needles with 2-3 μm long and 0.5-1 μm wide were piled up.

Examples 2 and 3: Balls with 0.5-2 μm in size were floated on the surface.

Comparative Example 1: Cracks of 2 μm or less in length were present on the whole surface at an interval of 2 μm or less.

Comparative Example 2: Cracks of 0.1-0.5 μm in width and about 5 in length were present at an interval of 2-5 μm.

Comparative Example 3: Almost no change from the original surface state.

EXAMPLE 4

The used crystallized glass had the following composition:

$B_2O_3$: 20% by mole
$SiO_2$: 15% by mole
MgO: 55% by mole
BaO: 5% by mole
SrO: 5% by mole The crystallized glass was washed with methyl ethyl ketone (MEK) for degreasing. After evaporating MEK completely, the surface roughening was conducted by dipping the crystallized glass substrate in a pure water added with 12 g/l of NaF (80° C., pH 7.6) for 50 minutes. The roughened surface was observed by SEM to reveal that particles of 0.5–2 μm in diameter were piled up. After washing the rougnened substrate in a flowing water, it was dipped in a dimethylformamide (DMF) solution for 1 minute. Then, the substrate was dipped in DMF dissolving 0.5 g/l of palladium chloride ($PdCl_2$) for 3 minutes, dipped in DMF for about 0.1 minute to remove superfluous $PdCl_2$ and then dipped in DMF containing 1 g/l of dimethylaminoboran (DMAB) for 3 minutes. The thus seeded substrate was dipped in pure water heated at the same temperature (70° C.) as the electroless plating solution for about 3 minutes so as to remove the seeder (Pd) which might be dropped off in a plating solution, followed by dipping in an electroless copper plating solution (70° C., pH 12.3) containing formaldehyde as a reducing agent.

The thus formed plated film was subjected to the measurement of adhesive strength, but the crystallized glass was broken at 2.8 kgf/mm². This means that the adhesive strength of the plated film is 2.8 kgf/mm² or more.

The adhesive strength in the case of using a usually used high-concentration HCl aqueous solution for seeding (catalyst coating step) was 0.2 to 0.5 kgf/mm².

When the surface states after the seeding were observed by SEM, the surface of the substrate of this invention was not changed after the roughening, while the roughened surfaces were broken more or less after seeded by using the high-concentration HCl solution.

Enameled wiring boards can be produced according to the process of this invention, for example, by the following steps:

PRODUCTION EXAMPLE 1

An enameled substrate obtained by coating a metal core with a crystallized enameled porcelain layer comprising a crystalline phase and a non-crystalline phase was subjected to the following steps:
(a) a step of roughening with a roughening solution having a larger dissolving rate as to the non-crystalline phase compared with the crystalline phase,
(b) a step of coating (or more precisely adsorbing) a catalyst which can start an electroless plating reaction, followed by forming a plating resist, or a step of forming a plating resist, followed by coating a catalyst which can start an electroless plating reaction, and
(c) a step of carrying out electroless plating.

PRODUCTION EXAMPLE 2

An enameled substrate obtained by coating a metal core with a crystallized enameled porcelain layer comprising a crystalline phase and a non-crystalline phase was subjected to the following steps:
(a) a step of roughening with a roughening solution having a larger dissolving rate as to the non-crystalline phase compared with the crystalline phase,
(b) a step of coating a catalyst which can start an electroless plating reaction,
(c) a step of carrying out electroless plating,
(d) a step of forming an etching resist on the plated film (tenting method), and
(e) a step of etching.

PRODUCTION EXAMPLE 3

An enameled substrate obtained by coating a metal core with a crystallized enameled porcelain layer comprising a crystalline phase and a non-crystalline phase was subjected to the following steps:
(a) a step of roughening with a roughening solution having a larger dissolving rate as to the non-crystalline phase compared with the crystalline phase,
(b) a step of coating a catalyst which can start an electroless plating reaction,
(c) a step of carrying out electroless plating,
(d) a step of forming a plating resist on the electroless plated film,
(e) a step of electroplating,
(f) a step of removing the plating resist, and
(g) a step of etching.

PRODUCTION EXAMPLE 4

An enameled substrate obtained by coating a metal core with a crystallized enameled porcelain layer comprising a crystalline phase and a non-crystalline phase was subjected to the following steps:
(a) a step of roughening with a roughening solution having a larger dissolving rate as to the non-crystalline phase compared with the crystalline phase,
(b) a step of coating a catalyst which can start an electroless plating reaction,
(c) a step of carrying out electroless plating,
(d) a step of forming a plating resist on the electroless plated film,
(e) a step of electroplating and solder plating,
(f) a step of removing the plating resist, and
(g) a step of etching.

In the above-mentioned Production Examples, the etching resist can be formed by a conventional printing method or developing method. The etching solution is required not to corrode the enamel layer. Further, in the above-mentioned Production Examples, it is important to carry out roughening, activation (seeding), plating, and etching without weakening the enamel layer. The enamel layer has a tendency to be weakened when contacted with a strong acid or strong alkali. Thus, when a strong acid or a strong alkali is used in any one of steps of roughening, activating and plating, the desired adhesive strength of the plated film cannot be obtained. Further, when a strong acid or a strong alkali is used only in the etching step, corrosion by the etching solution takes place at the interface of the plated film under the etching resist and the enamel layer. But such a problem can be solved by making the pH of all the treating solutions such as the seeding solution, the etching solution, the plating solution, etc. 2 to 13.

What is claimed is:
1. A process for metallizing a crystallized glass surface comprising a crystalline phase and a non-crystalline phase which comprises
   (a) a step of roughening the glass surface with a roughening solution having a larger dissolving rate for the non-crystalline phase as compared with the crystalline phase, said roughening solution being an aqueous solution of a fluoride salt having a pH of 5 to 10;

(b) a step of adsorbing a catalyst which can start an electroless plating reaction on the resulting roughened surface; and (c) a step of carrying out electroless plating on the roughened surface containing the catalyst; the crystallized glass containing boron, silicon, magnesium and barium in the following proportions and percents by mole;

$15 < B_2O_3 < 35$,
$10 < SiO_2 < 30$, and
$40 < MgO + CaO + BaO < 65$.

2. A process according to claim 1, wherein the catalyst is in the form of a non-aqueous solution.

3. A process according to claim 1, wherein the roughening solution is at temperatures from 70° to 85° C.

4. A process according to claim 1, wherein the roughened surface containing the catalyst, prior to electroless plating, is washed with water at the same temperature as the temperature of said plating solution.

5. A process according to claim 2, wherein the catalyst comprises Pd in an alkaline or neutral non-aqueous solution.

6. A process according to claim 1, wherein the fluoride salt is potassium fluoride.

7. A process according to claim 1, wherein the fluoride salt is sodium fluoride.

* * * * *